United States Patent [19]
Yokoto et al.

[11] Patent Number: 4,950,909
[45] Date of Patent: Aug. 21, 1990

[54] SAMPLE TILTING DEVICE IN ELECTRON MICROSCOPE

[75] Inventors: Takashi Yokoto, Shinjyou; Shigeto Isakozawa, Katsuta, both of Japan

[73] Assignee: Hitachi, Ltd., Tokyo, Japan

[21] Appl. No.: 223,643

[22] Filed: Jul. 25, 1988

[51] Int. Cl.$^5$ .............................................. G21K 5/00
[52] U.S. Cl. .............................. 250/442.1; 250/440.1
[58] Field of Search ........................... 250/440.1, 442.1

[56] References Cited

U.S. PATENT DOCUMENTS

| | | | |
|---|---|---|---|
| 4,405,865 | 9/1983 | Genty et al. | 250/442.1 |
| 4,710,633 | 12/1987 | Suzuki | 250/442.1 |
| 4,771,178 | 9/1988 | Egle et al. | 250/442.1 |

FOREIGN PATENT DOCUMENTS

| | | |
|---|---|---|
| 56914 | 5/1976 | Japan . |
| 58-173158 | 1/1983 | Japan . |

*Primary Examiner*—Bruce C. Anderson
*Attorney, Agent, or Firm*—Antonelli, Terry, Stout & Kraus

[57] ABSTRACT

A sample tilting device for use in an electron microscope provided with a microscope column in which a sample is illuminated by an electron beam. The sample is held in the microscope column and is removably supported by the microscope column so as to be capable of conically moving around a predetermined position. The sample is displacable in a direction transverse to the longitudinal axis of the electron beam by way of a threadable coupling between a motor and the shaft, with the shaft being axially displacable. The motor is supported by the microscope column so as to be rotatable together with the sample around a line passing through a predetermined position and crossing the axis of the electron beam.

9 Claims, 4 Drawing Sheets

SAMPLE TILTING DEVICE IN ELECTRON MICROSCOPE

BACKGROUND OF THE INVENTION

(1) Object of the Invention

The present invention relates to a sample tilting device in electron microscopes, and, more particularly, to a sample tilting device in electron microscopes which enables the prevention of shifting of a visual field when a sample is tilted.

(2) Description of Prior Art

A sample can be tilted at an arbitrary angle by the sample tilting device in electron microscopes. It is desirable in this sample tilting device that a so-called Eucentric condition, i.e. a condition that the tilting axis of the sample is unvaried, is satisfied. A sample tilting device in electron microscopes which is regarded as satisfying this condition is proposed in, for example, Japanese Patent Publication No. 914/1981.

However, the apparent from description, hereinbelow it has been experimentally determined that the tilting axis of a sample is varied in practice in this proposed sample tilting device thereby causing problem that a problem that shifting of an observed image and, accordingly, a visual field.

SUMMARY OF THE INVENTION

One object of the present invention is to furnish a sample tilting device in electron microscopes wherein no shifting of the visual field occurs when a sample is tilted.

Another object of the present invention is to furnish a sample tilting device in electron microscopes which enable a prevention of a change in the tilting axis of the sample.

According to the present invention, a sample tilting device in electron microscopes is provided which has a first cylinder inserted in the lateral direction with regard to an optical axis of an electron beam so that it can execute a conical motion around a predetermined fixed point of a microscope tube and a rotary motion around a central axis of its own, with a sample support supporting a sample at a fore end so that the sample is positioned on the optical axis of the electron beam and supported by the first cylinder. A second cylinder, interiorly accommodating the rear end part of the first cylinder, is fitted to the microscope tube so that it can be moved relative to the tube and rotated around the central axis thereof. A pair of differential shafts are fitted to the second cylinder and constructed so that the fore ends thereof engage with the rear end part of the first cylinder and move forward and backward in the radial direction of the second cylinder. A motor is mounted on the second cylinder and drives at least one of the differential shafts to move in the forward and backward directions.

Other objects, features, and advantages of the present invention will become more apparent from the following description when taken in connection with the accompanying drawings.

DESCRIPTION OF THE PREFERRED EMBODIMENTS

Figure 1:
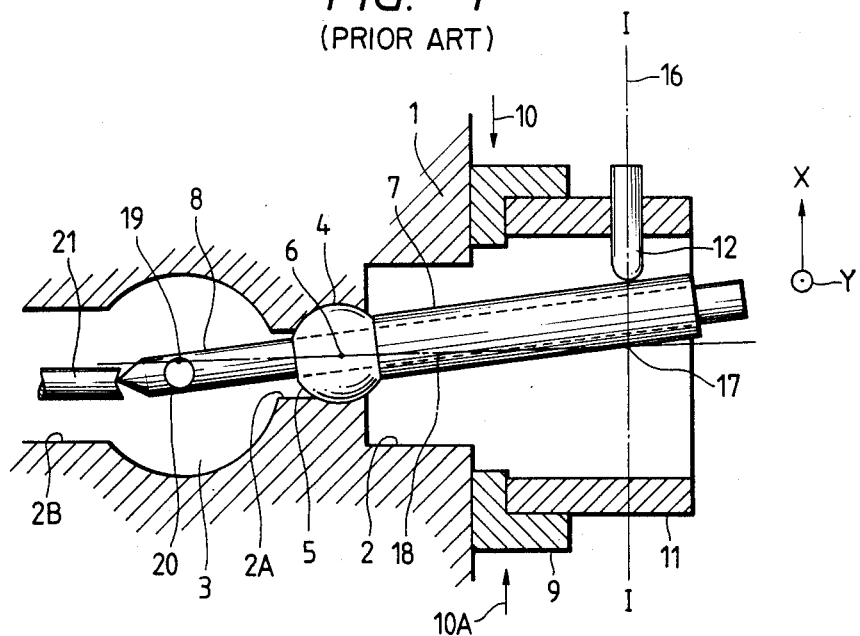
FIG. 1 is a cross-sectional view of a prior-art sample tilting device in electron microscopes.

As shown in FIG. 1, in a conventional sample tilting device of the type proposed in Japanese Patent Publication No. 914/1981, a tube 1 of an electron microscope is provided with through holes 2, 2A, 2B and a space forming a sample chamber 3. A spherical bearing 4 is formed inside of the through hole 2A so that it supports a spherical body 5. A fixed point 6 is provided on the central position of the spherical bearing 4, the position of which is not varied by any motion of the spherical body 5.

A first cylinder 7 inserted in the lateral direction with regard to the optical axis 19 of electron beam, and it is integrated with the spherical body 5 and constructed so that it can make conical or mortar and pestle-like motion around the fixed point 6 and rotary motion around the central axis thereof.

There is a coaxial through hole in the central part of the first cylinder 7, and a sample support 8 is supported therein. The sample support 8 extends into the space defining the sample chamber 3 through the spherical body 5.

A bearing 9 is located on a flat surface part of the side wall of the tube 1 and fitted thereto slidably only in the direction of an arrow 10 or 10A (i.e. in the tagential direction of a circle around the optical axis 19 of electron beam within a plane vertical to this axis, and a second cylinder 11 is fitted to this bearing 9 so that it can rotate in a prescribed position.

The reference numeral 17 denotes a point of intersection of a plane 16 containing sample with slightly-moving or sample fine adjusting means 12 only one of which is shown in the drawings, provided for rotating the outside end of the first cylinder 7 around the fixed point 6, with the central axis of rotation of the second cylinder 11. A fixed axial line 18 connects the point 17 of intersection and the fixed point 6.

As is apparent from FIG. 1, the relative position of the axial line 18 can be adjusted so that the extension thereof may intersect the optical axis 19 of electron beam, by moving the bearing 9 in the direction of the arrow 10 or 10A (in the vertical direction within the space of FIG. 1) so as to shift the intersecting point 17.

When the axial line 18 is once adjusted to intersect the optical axis 19 of electron beam in this way and the bearing 9 is fixed to the tube 1, the axial line 8 becomes unvaried and fixed thereafter even when the first cylinder 7 is driven arbitrarily in the X and Y directions inside the second cylinder 11.

Besides, sample 20 is mounted in the fore end of the sample support 8. A bearing 21 engages with the fore end of the sample support 8 and operates to move the sample 20 in the axial direction of the sample support 8.

The axial line 18 is formed by the above construction and intersects the optical axis 19 of electron beam by moving the bearing 9 slightly in the direction of the arrows 10–10A, and at the position of this intersection, the bearing 9 and the axial line 18 are fixed. Next, the sample 20 is moved within a plane perpendicular to the optical axis 19 by the sample fine adjusting means 12 so as to select a desired visual field, while the sample 20 is moved vertically to make a sample surface matched by a sample fine adjusting means 12, which is omitted from the figure.

When the second cylinder 11 is rotated by an angle $\theta$ (FIG. 4), for instance, in this state, the first cylinder 7 makes a mortar and pestle-like or conical motion inside the second cylinder 11 around the fixed axial line 18, on the fixed point 6 as a fulcrum, in the state wherein it is inclined at a prescribed angle to the fixed axial line 18, while the coordinate values of x and y thereof are completely retained. In other words, the first cylinder 7 rotates in a locus of a cone whose vertex is the fixed point 6 and whose radius is an amount R of deviation of the central axis of the first cylinder 7 from the fixed axial line 18 within a plane 16.

With the above-stated rotation, the angle of inclination of the sample 20 to the optical axis 19 of electron beam is also varied by an angle $\theta$. Since the optical axis 19 of electron beam and the fixed point 6 are located on the fixed axial line 18 on the occasion, as described above, the position of the visual field on the optical axis 19 of electron beam is not varied at all with the conical mortar and pestle rotation of the first cylinder 7.

That is, the Eucentric condition can be realized easily at an arbitrary position of the sample 20 by a simple mechanism, according to the construction of FIG. 1.

Figure 2:
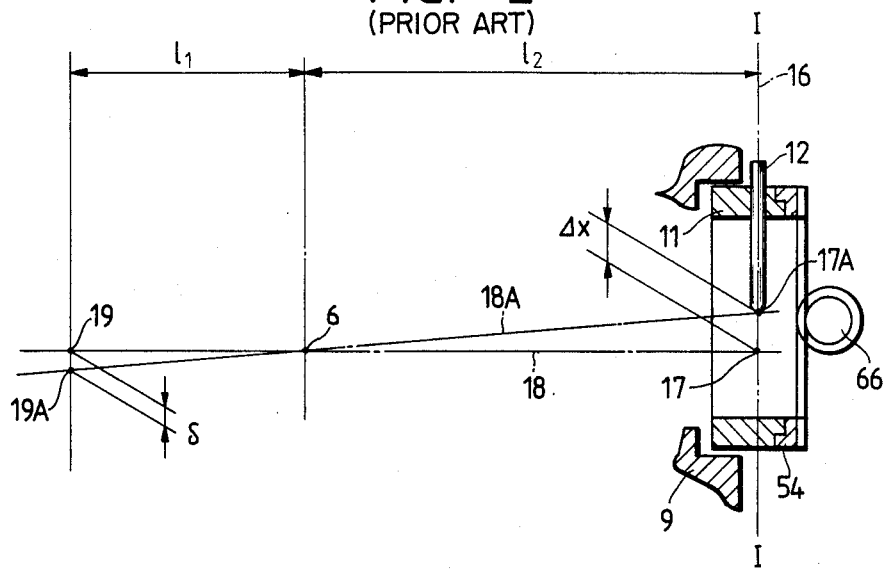
FIG. 2 is an illustration of a problem encountered with a sample tilting device of FIG. 1.
Figure 3:
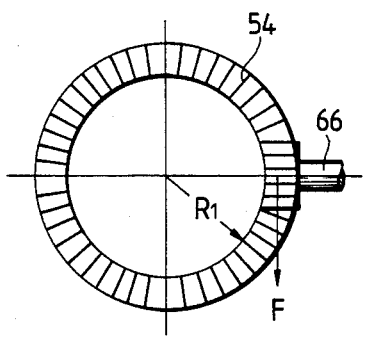
FIG. 3 is a side view of the sample tilting device of FIG. 1.

In the above-described Eucentric mechanism, the visual field is selected by moving the sample 20 horizontally within a plane perpendicular to the optical axis 19 of electron beam, and, for this purpose, a pinion 66 is rotated with an appropriate motion mechanism provided intermediately as shown in FIGS. 2 and 3 (though the detailed structure thereof is omitted from the figures).

Moreover, a face gear 54, provided in the end face of the second cylinder 11 so as to engage with the pinion 66, is rotated, and thereby a differential screw 12 which engages with the face gear 54 (the engagement is omitted from the figures) and whose fore end contact with the first cylinder 7 is moved forward and backward within the plane 16 and on a straight line in the axial direction to the aforesaid intersecting point 17.

The above-described construction gives a mechanism, as the result, in which the sample support 8 retaining the sample 20 and the first cylinder 7 are rotated on the fixed point 6 which is the center of the spherical body 5 and functions as the fulcrum, so as to move the sample 20 within the plane perpendicular to the optical axis 19 of the electron beam.

After the visual field is selected as described above, the second cylinder 11 is rotated by the angle $\theta$ around the central axis thereof. Then the first cylinder 7 makes conical rotating motion mortar and pestle-like motion around the fixed point 6 as the vertex with the rotation of the second cylinder, since the first cylinder 7 is integrated with the second cylinder by the differential screw 12.

At the same time, the first cylinder 7 rotates by the angle $\theta$ around the central axis of its own integrally with the sample support 8 inserted therethrough. In this way, the sample 20 is tilted by the angle $\theta$ to an electron beam.

When the Eucentric condition is satisfied, a straight line connecting the optical axis 19 of the electron beam and the fixed point 6 being the center of the spherical body 5 coincides with the central axis of rotation of the second cylinder 11, and, therefore, a point on the sample 20 which is positioned on the optical axis 19 of the electron beam is not varied. Accordingly, no shifting of a visual field and no consequent recession of an observed image occur in whatever way the sample 20 is moved to an arbitrary place or at whatever angle it is tilted.

In the above-described prior-art device, however, it was experienced that, when the sample 20 was moved horizontally to select the visual field, the shifting of the visual field and the consequent recession of the observed image occurred on the occasion of tilting of the sample 20 subsequent thereto even after adjustment was made to satisfy the Eucentric condition as described above.

In the investigation of the cause, it was confirmed experimentally that the central point of the second cylinder 11 (i.e. the intersecting point 17) was shifted several microns by a force of transmission of a gear-driving mechanism when the sample 20 was moved horizontally, in the above-described prior art, and, consequently, the Eucentric condition was not satisfied.

Next, it will be described with reference to FIGS. 2 to 4 that recession of an observed image in an amount $\Delta d$ occurs in the case when the Eucentric condition is broken by a transmission force F applied from outside by the horizontal movement of the sample 20.

Due to the transmission force F (FIG. 3) from outside which is generated when the pinion 66 is rotated, a moment expressed as $$M = F \cdot R_1 \quad (R_1: \text{the radius of the second cylinder 54})$$

acts on the second cylinder 11. Since there is always a structural fit clearance between the second cylinder 11 and the bearing (fixed base) 9 supporting this cylinder 11, the intersecting point 17 is shifted to 17A (FIG. 2) by the aforesaid moment, and, consequently, a deviation of the center by $\Delta x$ is brought about.

Due to this deviation, a new slanting axial center line 18A is formed as 17A - 6 - 19A shown in FIG. 2. A deviation amount $\delta$ on the optical axis 19 of electron beam on the occasion is expressed as $$\delta = \Delta x \cdot l_1 / l_2,$$

when a distance between the points 6 and 19 is denoted by $l_1$ and a distance between the points 6 and 17 by $l_2$ in FIG. 2. When the second cylinder 11 is rotated around the axis 18 to tilt the sample by the angle $\theta$ in this state, the point on the sample 20 positioned on the optical axis 19 of electron beam is shifted from 19 to 19B by $\Delta d$, as shown in FIG. 4.

When viewed from an observer, as a result, an image or a visual field recedes by $\Delta d$, and thus the tilting of the sample in observation results in recession of a target image and, in an extreme case, loss of sight thereof.

Figure 4:
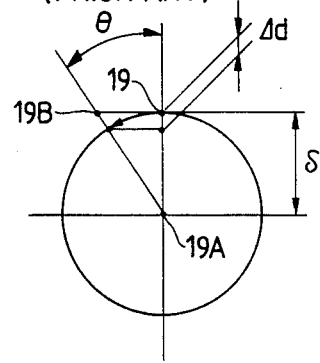
FIG. 4 is an illustration of a shifting of a visual field in FIG. 2.

This recession amount $\Delta d$ is expressed as $$\Delta d = \delta(1 - \cos\theta) \qquad (1)$$
$$= \Delta x \cdot l_1(1 - \cos\theta)/l_2$$

as shown in FIG. 4.

Now, in order to reduce the recession amount Δd to 0.1 μm (this means that the recession amount of the image on a fluorescent screen is 100 mm in the case when the magnification of an electron microscope is set at million in observation) or less, the aforesaid deviation amount Δx of the center of the second cylinder 11 must be held within:

$$\Delta x = 2l \cdot \Delta d / l1(1 - \cos \theta)$$

according to the equation (1).

When l1=40 mm, l2=100 mm and the tilt angle θ=60° in this case, the amount Δx must be held down to be 0.5 μm or less.

In order to lessen the value of said Δx, it is necessary, in practice, to reduce to the utmost the fit tolerance between the second cylinder 11 and the bearing 9, a fixed base, or to provide a mechanism which enables the prevention of deviation of the center of the second cylinder 11 due to the force transmitted to the second cylinder 11 through the pinion 66 etc. However, such means have been regarded as impossible in terms of machining precision and restrictions in a mechanism.

Additionally, as is apparent from FIG. 4, the height of the sample 20 is varied by sin θ also in the direction of the optical axis 19 of electron beam due to the inclination of the sample 20 by the angle θ. Although this variation causes defocussing of an image, it does not matter substantially at all, since the defocussing can be corrected easily by adjusting an exciting current for an electron lens.

The present invention furnishes a sample tilting device in an electron microscope which enables easy transfer of a sample 20 while preventing an external force obstructing the Eucentric condition from acting on the second cylinder 11, or, in other words, which satisfies the Eucentric condition at all times whatever horizontal transfer of the sample 20 is conducted.

According to the present invention, an electrically-driven straight transfer mechanism body, as a driving means acting directly on the first cylinder retaining the sample support so as to move the sample horizontally, is fixed directly to the second cylinder provided for tilting the sample, without being linked mechanically to any other structures of the microscope tube, so as to prevent an external stress from acting on the second cylinder 11 to cause the deviation of the center thereof, when the sample 20 is moved horizontally.

Besides, in Japanese Utility Model Laid-Open No. 173158/1983, a construction is disclosed wherein a driving device for adjusting the height position of a sample is fitted directly to a cylinder for tilting the sample.

However, the height position of the sample in an electron microscope is adjusted generally to be at a predetermined position of an electron lens, and after adjustment is once completed, it is half-fixed in employment.

In the last-mentioned construction no consideration is given to the Eucentric condition.

Even if the center of the cylinder for tilting the sample is aligned to prepare the Eucentric condition after the adjustment of the height position of the sample, the same force to obstruct the Eucentric condition as in the foregoing description will act on said cylinder, if a conventional sample horizontal transfer arrangement known heretofore is combined therewith. Consequently, the deviation of the central axis of the cylinder occurs, and thus there still remains the problem that an actual visual field is varied with the inclination of the sample and this causes the recession of an observed image.

The straight transfer mechanism body for horizontal transfer of the sample, which is separated from other structures and fitted directly to the second cylinder, is driven electrically, and it is integrated with the first and second cylinders and makes rotation mortar and pestle-like motion at an arbitrary angle along a circular cone whose vertex is the fixed point, the center of the spherical body, when the sample is tilted.

According to this construction and the operation thereof, no external force causing the slippage of the relative position of the second cylinder in relative to the bearing, i.e. the fixed base, acts on the second cylinder, and consequently the deviation of the central axis of the second cylinder is eliminated.

After adjustment is once made to satisfy the Eucentric condition, therefore, this condition is never broken no matter how the sample is moved horizontally for selection of a visual field, and thus the inclination of the sample causes no shifting of the visual field and no consequent recession of an observed image.

Figure 5:
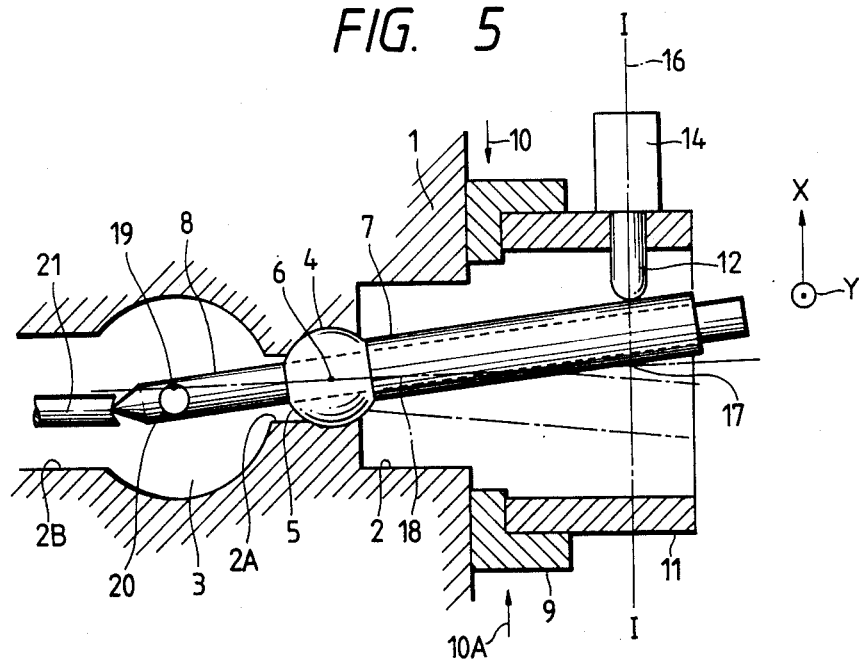
FIG. 5 is a cross-sectional view of a sample tilting device in electron microscopes in accordance with the present invention.
Figure 6:
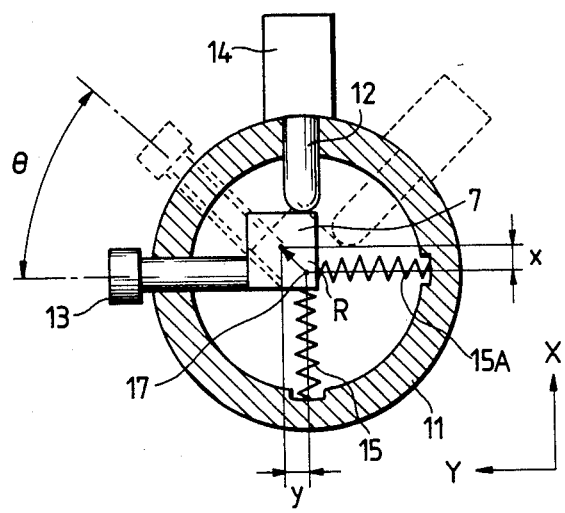
FIG. 6 is a cross-sectional view taken along a line I—I in FIG. 5.
Figure 7:
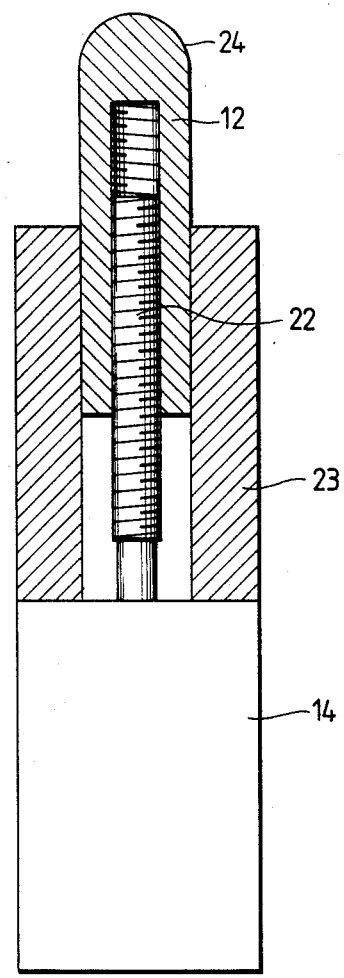
FIG. 7 is a longitudinal cross-sectional view of differential shaft member shown in FIGS. 5 and 6.

In accordance with the present invention, as shown in FIGS. 5 to 7, a differential shaft, i.e. a differential screw, is provided for moving one end (the right end in FIG. 1) of the first cylinder 7 along the X-coordinate (in the direction vertical to the optical axis 19 of electron beam) inside the second cylinder 11 so as to move the sample 20 horizontally within a plane vertical to the optical axis 19 for selection of a visual field.

A differential shaft 13, i.e. a differential screw, is provided for moving one end of the first cylinder 7 along the direction Y (the direction parallel to the optical axis 19 of electron beam) inside the second cylinder 11 so as to adjust the height of the sample 20. A motor 14 drives the differential screw 12 electrically, and it is fixed to the second cylinder 11. Springs 15, 15A press the first cylinder 7 against the differential screws 12 and 13 in the directions X and Y, respectively, and they are disposed within the same plane containing a section 16 vertical to the central axis of the second cylinder 11.

Reference numeral 17 denotes a point of intersection of the plane 16 containing the differential screws 12 and 13 and the central axis of rotation of the second cylinder 11, and reference numeral 18 denotes a fixed axial line connecting the point 17 of intersection and the fixed point (the center of the spherical body 5) 6.

The differential screw 12 includes a feed screw 22 linked to the motor 14 and a shaft 24 threadably coupled the feed on screw 22, and the shaft 24 is engaged with a guide 23 fixed to the motor 14 so that it can move in the axial direction, but is prevented from rotation.

In FIG. 5, the bearing 9 is moved in the direction of the arrow 10 or 10A for adjustment to make the axial line 18 connecting the intersecting point 17 and the fixed point 6 pass the optical axis 19 of electron beam so as to prepare the Eucentric condition, in the same way as in the prior-art example of FIG. 1.

When a visual field is selected in the embodiment of FIGS. 5–7, the motor 14 is driven to move the differential screw 12 forward and backward. With the movement of the screw 12, the differential first cylinder 7 and the sample 20 on the sample support 8 rotate around the fixed point 6 when viewed within the space of FIG. 5.

Selection of the position of the sample 20 in the longitudinal direction (in FIG. 5) in the main is thereby performed. Selection of the position of the sample 20 in the lateral direction in the main is realized by the forward and backward movement of the bearing 21.

Setting of the position of the sample, i.e. the selection of a visual field, within a horizontal plane vertical to the optical axis 19 of electron beam is conducted as described above. The adjustment of the height (the position on the optical axis 19 of electron beam) of the sample 20 is performed by adjusting the differential screw 13.

After the Eucentric condition is set and the visual field is selected as described above, the second cylinder 11 is rotated around the bearing 9 and the fixed axial line 18. Thereby the angle of inclination of the sample 20 to the optical axis 19 of electron beam is adjusted as described previously with regard to FIG. 1.

While the structure wherein the bearing 21 contacts with the fore end of the sample support 8 is adopted in the embodiment of FIGS. 5-7, the sample support 8 itself may also be moved forward and backward inside the first cylinder 7. Besides, the motor 14 may not be of an electric type, but of a fluid pressure type such as a hydraulic pressure type.

According to the present invention, the differential screw 12 for moving the sample, which is provided in the second cylinder, is driven electrically (or by using a fluid pressure) by the motor 14 provided also in the second cylinder. Therefore, such an external force as displacing the second cylinder 11 in relation to the bearing 9 does not act at all when a visual field is adjusted by the differential screw 12.

Therefore, no deviation of the central axis of rotation of the second cylinder 11 occurs even when the operation of horizontal transfer of a sample is conducted after the Eucentric condition is set by adjustment of the position of the bearing 9, and accordingly, no recession of an observed image occurs when said second cylinder 11 is rotated to tilt the sample 20. This facilitates the selection of the visual field of a target sample and the tilting of the sample.

Moreover, since a complicated gear transmission mechanism for moving the differential screws forward and backward and the like are dispensed with, the performance of the differential devices, such as the precision in transfer and tilting of a sample, the vibration resistance, etc., and the life thereof can be improved. In addition, troublesome adjustment of combinations of gears is dispensed with, and thus stable performance and high reliability can be attained.

What is claimed is:

1. A sample tilting device for an electron microscope including a microscope tube means for accommodating a sample illuminated by an electron beam, the sample tilting device comprising:
    means for holding the sample in the microscope tube means;
    means for removably supporting the means for holding the sample in said microscope tube means so as to enable conical movement about a predetermined position;
    means for displacing the sample in a direction transverse to a longitudinal axis of the electron beam including a motor means, a coupling means connected to said motor means so as to be rotated thereby, a shaft means engagable with the coupling means and in contact with the means for supporting the means holding the sample, and means for preventing a rotation of the shaft means around a center axis thereof while permitting an axial movement of the shaft means; and
    means for supporting the motor means by said microscope tube means so as to be rotatable together with the sample about a line passing through the predetermined position and crossing said longitudinal axis of the electron beam.

2. A sample tilting device according to claim 1, wherein the means for preventing rotation of the shaft means includes a guide means integrated with the motor means along which the shaft means slides in an axial direction.

3. A sample tilting device according to one of claims 1 or 2, further comprising means supported by the motor supporting means for displacing the sample in the longitudinal direction of the electron beam.

4. A sample tilting device according to claim 3, wherein said coupling means includes a thread means engagable with a corresponding thread means on the shaft means.

5. A sample tilting device for an electron microscope including a microscope tube means for accommodating a sample illuminated by an electron beam, the sample tilting device comprising:
    a substantially bar-like sample holder means for holding the sample in the microscope tube means;
    a first tubular means for removably accommodating the substantially bar-like sample holder, said first tubular means extending from an interior of the microscope tube means to an outside thereof and being supported by the microscope tube means at a predetermined position thereof so as to enable conical movement around a predetermined position and rotating about a center axis of the first tubular means;
    a second tubular means for accommodating an outer end portion of the first tubular means, said second tubular means being supported by the microscope tube means so as to be rotatable about a center axis of the second tubular means;
    means for displacing the sample in a direction transverse to a longitudinal axis of the electron beam including a motor means secured to the second tubular means, a coupling means connected to the motor means so as to be rotated thereby, a shaft means engagable with the coupling means and in contact with the second tubular means, and means for preventing a rotation of the shaft means while permitting an axial movement of the shaft means.

6. A sample tilting device according to claim 5, wherein the second tubular means is moveable in a direction substantially perpendicular to the longitudinal axis of the electron beam.

7. A sample tilting device according to claim 6, further comprising a second means for displacing the sample in a direction substantially perpendicular to the direction in which the sample is displaced by said first mentioned sample displacing means.

8. A sample tilting device according to claim 6, further comprising means for displacing the sample in a direction of a center axis of the substantially bar-like sample holder means.

9. A sample tilting device according to one of claims 5, 7, or 8, wherein said coupling means includes a thread means engagable with a corresponding thread means on the shaft means.

* * * * *